United States Patent
Nagashima et al.

(10) Patent No.: US 6,313,991 B1
(45) Date of Patent: Nov. 6, 2001

(54) POWER ELECTRONICS SYSTEM WITH FULLY-INTEGRATED COOLING

(75) Inventors: James M. Nagashima, Cerritos; Terence G. Ward, Redondo Beach; Scott D. Downer, Torrance, all of CA (US)

(73) Assignee: General Motors Corporation, Detroit, MI (US)

( * ) Notice: Subject to any disclaimer, the term of this patent is extended or adjusted under 35 U.S.C. 154(b) by 0 days.

(21) Appl. No.: 09/624,511

(22) Filed: Jul. 24, 2000

(51) Int. Cl.[7] ................................................. H05H 7/20
(52) U.S. Cl. ..................... 361/699; 165/80.4; 174/16.3; 174/88 B; 361/704; 361/715; 361/830; 257/714
(58) Field of Search ............................. 165/80.2, 80.4, 165/185; 174/16.3, 71 B, 72 B, 88 B, 70 B, 99 B; 257/714, 722; 361/648–650, 688–690, 698–699, 704, 707, 715, 775, 830

(56) References Cited

U.S. PATENT DOCUMENTS

| | | | |
|---|---|---|---|
| 5,694,301 | * | 12/1997 | Donegan et al. ................... 361/830 |
| 5,740,015 | * | 4/1998 | Donegan et al. ................... 361/699 |
| 5,841,634 | * | 11/1998 | Visser ................................ 361/699 |
| 5,940,263 | * | 8/1999 | Jakoubovitch .................... 361/830 |
| 6,088,227 | * | 7/2000 | Bujtas et al. ..................... 361/775 |

* cited by examiner

Primary Examiner—Gregory Thompson
(74) Attorney, Agent, or Firm—Christopher DeVries

(57) ABSTRACT

A thermally cooled power electronics system. A cooling housing has a body with a coolant cavity formed in one surface and a capacitor bus assembly potting cavity formed in an opposite surface. A bus bar passthrough opening is formed through the body, along with a coolant inlet and outlet manifolds having a coolant cavity inlet outlet that are coupled to respective ends of the coolant cavity. An environmental sealing gasket surrounds the coolant cavity. A plurality of laminated copper bus bars are disposed through the bus bar passthrough opening. A laminated horizontal bus bar assembly extends along the length of the housing above the coolant cavity and has horizontal bus bars that are coupled to the laminated copper bus bars. A battery input connector is coupled by way of a vertical bus bar assembly to the horizontal bus bar assembly. A plurality of power switching devices are coupled to the laminated horizontal bus bar assembly. A heat sink is coupled to the plurality of power switching devices and thermally coupled to the coolant cavity. A plurality of capacitors are secured in the capacitor bus assembly potting cavity that are coupled by way of the laminated copper bus bars to the horizontal bus bar assembly.

13 Claims, 2 Drawing Sheets

US 6,313,991 B1

POWER ELECTRONICS SYSTEM WITH FULLY-INTEGRATED COOLING

TECHNICAL FIELD

The present invention relates generally to electric vehicles and, more particularly, to an integrated power electronics cooling housing for use in a power electronics system.

BACKGROUND OF THE INVENTION

The assignee of the present invention manufactures electric vehicles. The electric vehicle uses a power electronics system that is used to distribute electrical power to various components in the vehicle.

Prior art related to cooling of power electronics systems involves liquid cooling of power semiconductor devices using a discrete heat exchanger electrically connected to a chassis, combined with air cooling of other dissipating components (either directly to air or by conduction to chassis and air cooling of the chassis). Disadvantages of conventional cooling arrangements are as follows.

The heat exchanger is only used once for the power semiconductor devices. Air-cooling of other heat-dissipating components is less effective than cooling provided by a liquid cooling path, which results in higher operating temperatures and lower reliability. The capacitance of the power semiconductor devices relative to the chassis is higher, which results in higher injected currents that generate electromagnetic interference (EMI).

It would therefore be desirable to have an improved power electronics system having integrated cooling that may be used in an electric vehicle, for example, and that overcomes the limitations of conventional implementations.

SUMMARY OF THE INVENTION

The present invention comprises an improved power electronics system having integrated cooling. An exemplary system comprises a cooling housing having a body having a coolant cavity formed in one surface and having a capacitor bus assembly potting cavity formed in an opposite surface, a bus bar passthrough opening formed through the body, a coolant inlet manifold having a coolant cavity inlet and a coolant outlet manifold having a coolant cavity outlet formed in the body that are coupled to respective ends of the coolant cavity, and an environmental sealing gasket surrounding the coolant cavity.

A plurality of laminated copper bus bars are disposed through the bus bar passthrough opening. A laminated horizontal bus bar assembly extends along the length of the housing above the coolant cavity and has horizontal bus bars that are coupled to the laminated copper bus bars. A battery input connector is coupled by way of a vertical bus bar assembly to the horizontal bus bar assembly.

A plurality of power switching devices are coupled to the laminated horizontal bus bar assembly. A heat sink is coupled to the plurality of power switching devices and thermally coupled to the coolant cavity. A plurality of capacitors are secured in the capacitor bus assembly potting cavity that are coupled by way of the laminated copper bus bars to the horizontal bus bar assembly.

All power-dissipating components coupled to the housing are liquid-cooled by the same coolant loop through the housing. The housing is designed to accept a thermal plate and environmental sealing gasket for use with high power dissipating devices. The housing has coolant inlet and outlet ports, a coolant cavity, thermal interfaces and component mounting and potting features. Low power dissipating devices are cooled through the housing by the coolant cavity. The housing is designed for automotive and other dynamic environments. The housing is designed to have a minimal parts count and a low number of electrical interconnects to provide higher reliability. All electronic components may be electrically-isolated from the chassis for EMI shielding and safety if the housing is made of dielectric material. The concepts of the present invention are generally applicable to inverters, power supplies, and other power electronics devices.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DESCRIPTION OF THE PREFERRED EMBODIMENT

Figure 1:
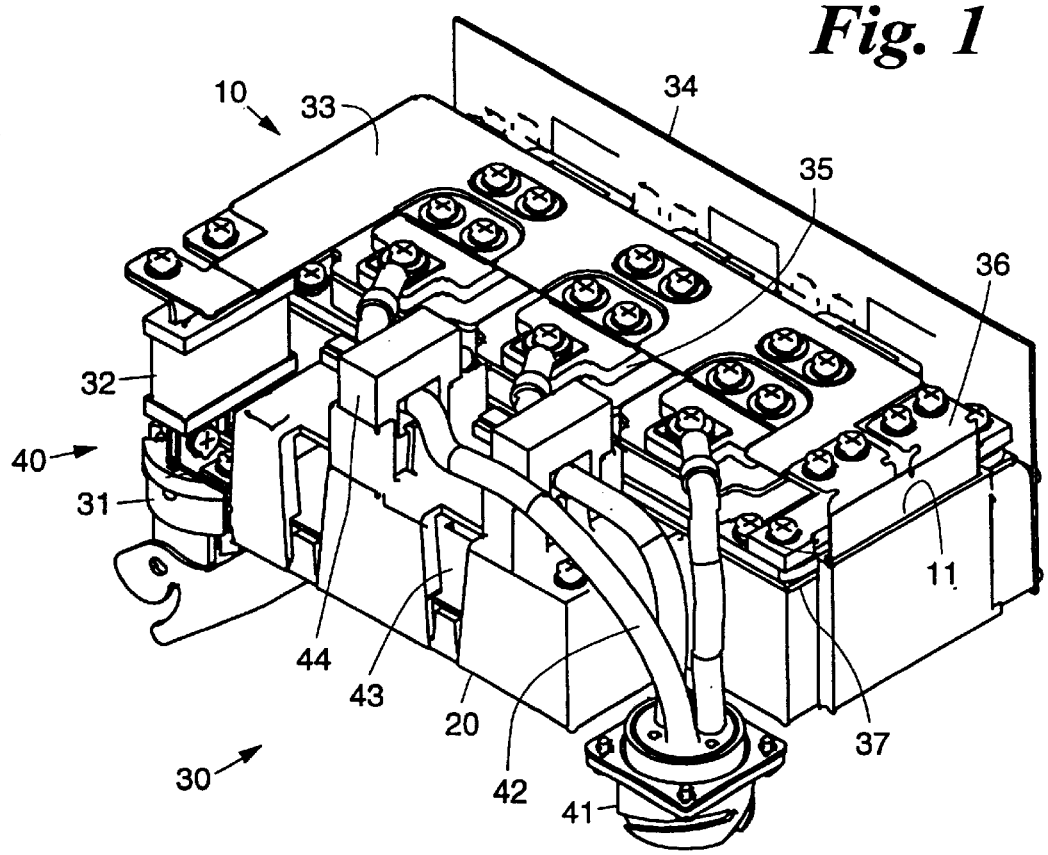
FIG. 1 is a top perspective view of an exemplary power electronics system in accordance with the principles of the present invention.
Figure 2:
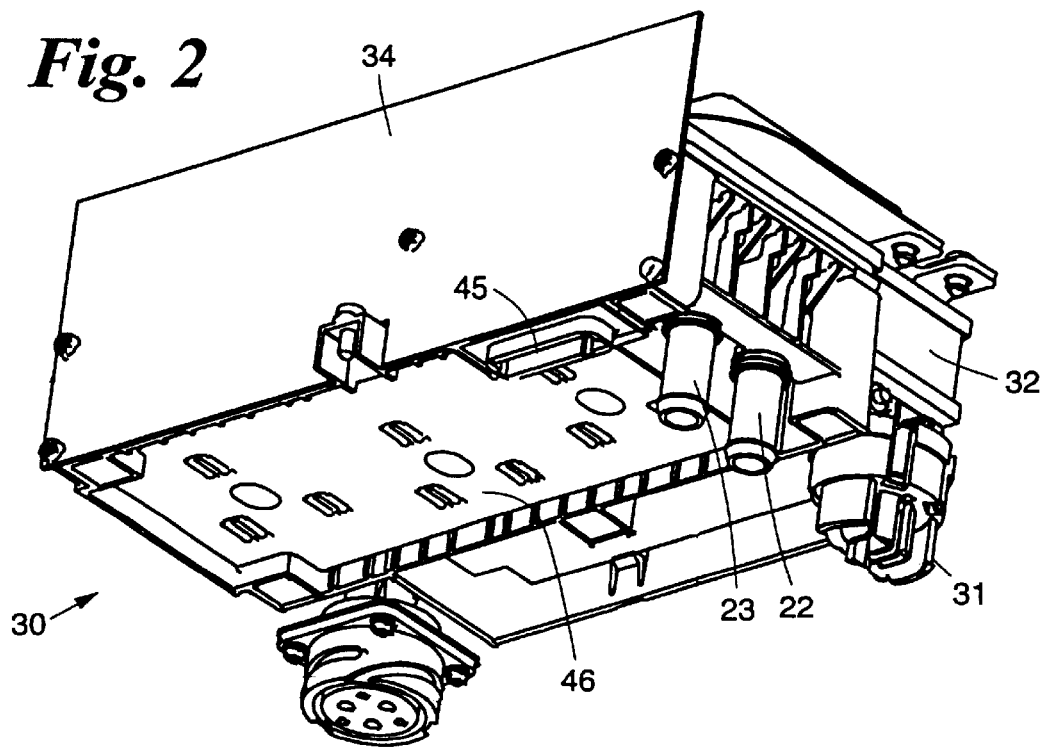
FIG. 2 is a bottom perspective view of the power electronics system of FIG. 1.

Referring to the drawing figures, FIG. 1 is a perspective view of the top of an exemplary power electronics system 30 having integrated cooling in accordance with the principles of the present invention. FIG. 2 is a perspective view of the bottom of the power electronics system 30. The power electronics system 30 employs an improved power electronics cooling housing 10. The power electronics cooling housing 10 forms the central component in the system 30.

Figure 3:
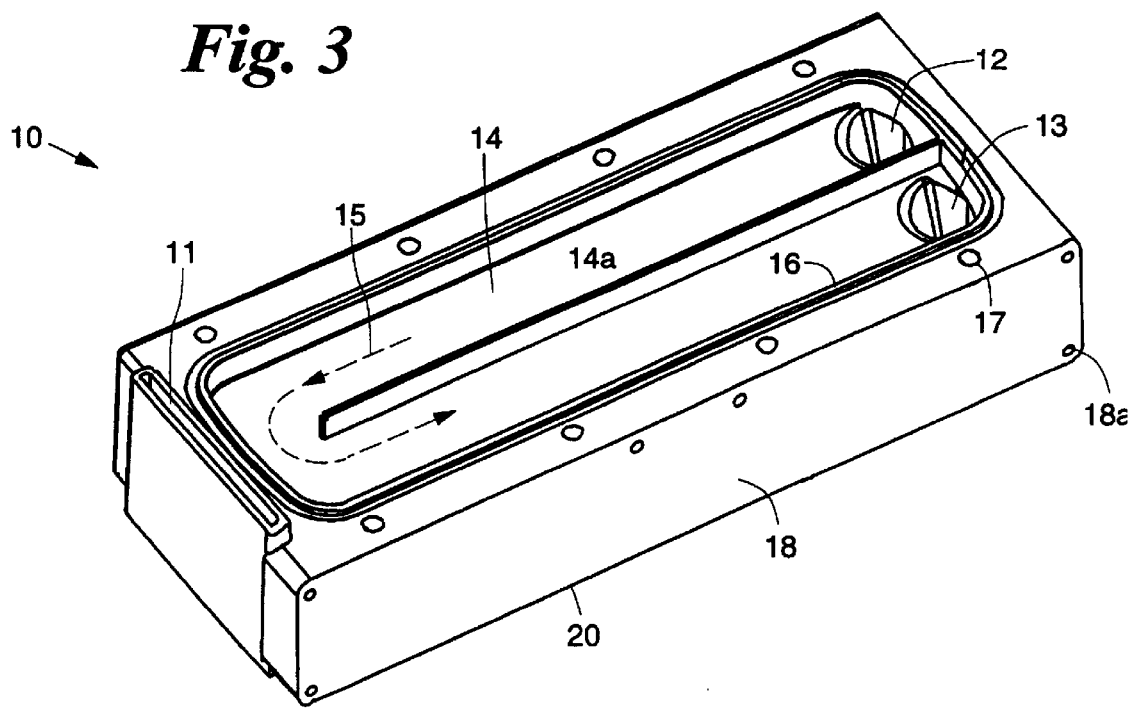
FIG. 3 is a perspective view of an exemplary power electronics cooling housing used in the power electronics system of FIG. 1.
Figure 4:
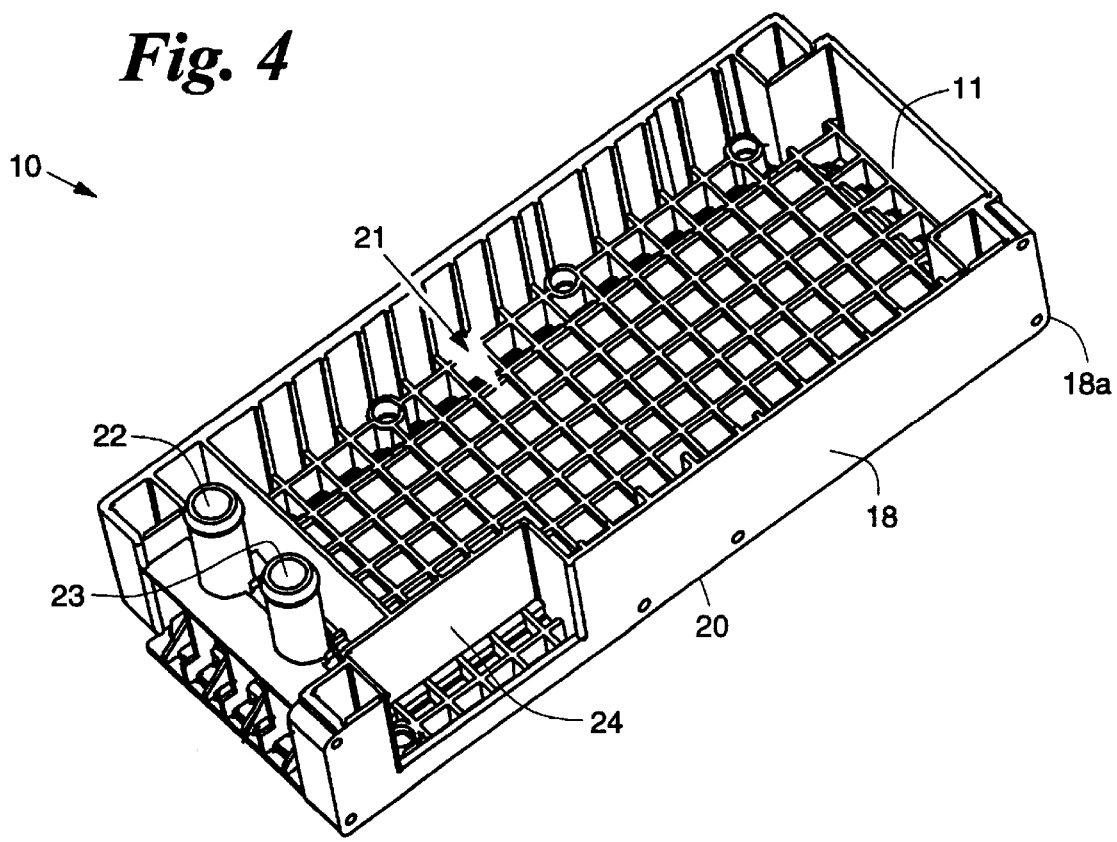
FIG. 4 is a perspective view of the bottom of the power electronics cooling housing of FIG. 3.

The power electronics cooling housing 10 will first be discussed since it forms the heart of the power electronics system 30. FIG. 3 is a top perspective view of an exemplary power electronics cooling housing 10. FIG. 4 illustrates a bottom perspective view of the housing 10 shown in FIG. 3.

As is shown in FIG. 1, the power electronics cooling housing 10 has a generally rectangular body 20 which is preferably plastic or dielectric material and which is manufactured using relatively low cost injection-molded construction techniques. The body 20 is relatively narrow having narrow ends and relatively elongated sides. The body 20 has a bus bar passthrough opening 11 at one end. As is shown in FIG. 3, the bus bar passthrough opening 11 has a plurality of laminated copper bus bars 36 disposed therethrough that conduct current though the power electronics cooling housing 10.

A coolant cavity inlet 12 and coolant cavity outlet 13 are provided at the opposite end of the body 20 from the bus bar passthrough opening 11. The coolant cavity inlet 12 and outlet 13 open to a U-shaped coolant cavity 14 formed adjacent the top of the body 20. Coolant 14a is caused to flow into the inlet 12, through the U-shaped coolant cavity 14 and out the outlet 13 as is illustrated by the dashed U-shaped arrow 15.

An environmental sealing gasket 16 surrounds the coolant cavity 14 at the top surface of the body 20. The environmental sealing gasket 16 is applied to the perimeter of and surrounds the coolant cavity 14. Thermal plate mounting holes 17 are formed in the top surface of the body 20 surrounding the environmental sealing gasket 16. A circuit board mounting surface 18 is provided on each elongated side of the body 20 including a plurality of mounting holes 18a.

As is shown in FIG. 2, the bottom of the power electronics cooling housing 10 has a relatively large cavity 21 comprising a capacitor bus assembly potting cavity. A capacitor bus assembly (not shown) is secured in the cavity 21 using potting cement (not shown) when the power electronics system 30 is assembled. The coolant cavity inlet 12 and outlet 13 shown in FIG. 1 are respectively coupled to a coolant inlet manifold 22 and coolant outlet manifold 23 formed as part of the body 20 that are coupled to a coolant source (not shown) including a pump and radiator, for example.

A portion of the body 20 is configured to provide a connector housing 24 having a metallized surface that provides electrical shielding. A portion of the circuit board mounting surface 18 not seen in FIG. 1 is shown on the elongated side of the body 20 next to the connector housing 24, which also includes a plurality of mounting holes 18a.

The power electronics cooling housing 10 is the central element in the power electronics system 30 and provides cooling therefor. The balance of the power electronics system 30 will now be discussed with reference to FIGS. 1 and 2.

Referring to FIG. 3, the laminated copper bus bars 36 are disposed in the passthrough opening 11 and are respectively coupled to horizontal bus bars of a flat, L-shaped laminated horizontal bus bar assembly 33 that extends along the length of the housing 10 above the U-shaped coolant cavity 14. A battery input connector 31 is cast or formed in a chassis (not shown) adjacent to the housing 10. An input EMI choke 32, or common-mode choke 32, is incorporated in a vertical bus bar assembly 40 that couples the battery input connector 31 to the horizontal bus bar assembly 33.

Input power is distributed to a plurality of IGBT modules 35 comprising power switching devices 35 by way of the laminated horizontal bus bar assembly 33. The plurality of IGBT modules 35 are mounted to a pin-fin heat sink 37. The integral pin-fin heat sink 37 is mounted with the environmental sealing gasket 16 to the body 20 of the housing 10, which provides a coolant channel 14 for immersion of pin-fins (not shown). The laminated copper bus bars 36 connect capacitors potted in the cavity 21 in the under side of the body 20 to the horizontal bus bar assembly 33 which distributes power to the IGBT modules 35.

A control printed circuit board 34 is mounted to one side of the body 20, which provides a mechanical attachment using the plurality of mounting holes 18a formed in the circuit board mounting surface 18. The circuit board mounting surface 18 also provides a thermal interface for the control printed circuit board 34. EMI PCB mechanical retention 43 is incorporated in the body 20 of the housing 10 to retain the control printed circuit board 34.

A motor connector 41 has a wiring harness 42 containing wires that are coupled to the plurality of IGBT modules 35. A plurality of mechanical retention elements 44 are incorporated in the body 20 that retain current sensors (not shown) in the motor signal path.

A signal connector back-shell 45 is incorporated in the body 20 of the housing 10. The signal connector back-shell 45 couples control signals to the control printed circuit board 34. Capacitors and capacitor bus bars (not shown) are potted in the cavity 21.

The power electronics cooling housing 10 used in the power electronics system 30 may be manufactured using relatively low cost injection-molded plastic construction techniques. There are fewer components in the power electronics cooling housing 10 than in conventional housings, and it is easier to manufacture and allows reduced assembly time for the power electronics system 30. Use of the power electronics cooling housing 10 results in a smaller physical size of the power electronics system 30. The power electronics cooling housing 10 has fewer and improved thermal interfaces that provides for better cooling of the power electronics system 30. The power electronics cooling housing 10 has higher reliability because it has fewer parts and provides improved cooling, which results in an improved power electronics system 30. The power electronics cooling housing 10 and power electronics system 30 generate lower electromagnetic interference due to the reduced capacitance between the housing 10 and the chassis.

The power electronics system 30 may be advantageously employed in electric vehicles such as those manufactured by the assignee of the present invention and in electric vehicle charging systems for use in charging propulsion batteries of such electric vehicles. The power electronics system 30 may also be adapted for use with inverters, power supplies, and other power electronics devices.

Thus, an improved power electronics system having integrated cooling has been disclosed. It is to be understood that the above-described embodiment is merely illustrative of one of the many specific embodiments that represent applications of the principles of the present invention. Clearly, numerous and other arrangements can readily be devised by those skilled in the art without departing from the scope of the invention.

What is claimed is:

1. A power electronics system having integrated cooling comprising:

a cooling housing comprising a body having a coolant cavity formed in one surface and having a capacitor bus assembly potting cavity formed in an opposite surface, a bus bar passthrough opening formed through the body, a coolant inlet manifold having a coolant cavity inlet and a coolant outlet manifold having a coolant cavity outlet formed in the body that are coupled to respective ends of the coolant cavity, and an environmental sealing gasket surrounding the coolant cavity;

a plurality of laminated copper bus bars disposed through the bus bar passthrough opening;

a laminated horizontal bus bar assembly that extends along the length of the housing above the coolant cavity and having horizontal bus bars are coupled to the laminated copper bus bars;

a battery input connector;

a vertical bus bar assembly that couples the battery input connector to the horizontal bus bar assembly;

a plurality of power switching devices coupled to the laminated horizontal bus bar assembly;

a heat sink coupled to the plurality of power switching devices and thermally coupled to the coolant cavity; and a plurality of capacitors secured in the capacitor bus assembly potting cavity that are coupled by way of the laminated copper bus bars to the horizontal bus bar assembly.

2. The system recited in claim 1 further comprising:
a control printed circuit board secured to one side of the body; and
a signal connector incorporated in the body that couples control signals to the control printed circuit board.

3. The system recited in claim 1 wherein the capacitors are potted in the cavity.

4. The system recited in claim 1 further comprising a motor connector and wiring harness containing wires that are coupled to the plurality of power switching devices.

5. The system recited in claim 1 wherein the laminated horizontal bus bar assembly comprises a flat, L-shaped laminated horizontal bus bar assembly.

6. The system recited in claim 1 wherein the power switching devices comprise a plurality of IGBT modules.

7. The system recited in claim 1 wherein the vertical bus bar assembly includes an input EMI choke.

8. The system recited in claim 1 wherein the heat sink comprises a pin-fin heat sink coupled to the plurality of power switching devices that include a plurality of pin fins that are disposed in the coolant cavity.

9. The system recited in claim 1 wherein the body comprises dielectric material.

10. The system recited in claim 1 wherein the body comprises plastic.

11. The system recited in claim 1 wherein the coolant cavity comprises a U-shaped coolant cavity.

12. The system recited in claim 1 wherein a portion of the body is configured to provide a connector housing having a metallized surface that provides electrical shielding for a connector.

13. The system recited in claim 1 further comprising a circuit board mounting surface on selected sides of the body.

* * * * *